United States Patent
Johnson, Jr.

(10) Patent No.: US 8,587,929 B2
(45) Date of Patent: Nov. 19, 2013

(54) HIGH DENSITY UNINTERRUPTIBLE POWER SUPPLIES AND RELATED SYSTEMS AND POWER DISTRIBUTION UNITS

(75) Inventor: Robert William Johnson, Jr., Raleigh, NC (US)

(73) Assignee: Eaton Corporation, Cleveland, OH (US)

( * ) Notice: Subject to any disclaimer, the term of this patent is extended or adjusted under 35 U.S.C. 154(b) by 169 days.

(21) Appl. No.: 12/910,469

(22) Filed: Oct. 22, 2010

(65) Prior Publication Data
US 2012/0098342 A1 Apr. 26, 2012

(51) Int. Cl.
*H02J 9/00* (2006.01)

(52) U.S. Cl.
USPC ........... 361/601; 361/622; 361/624; 361/641; 307/32; 307/39; 307/64; 307/65; 307/66; 312/223.2

(58) Field of Classification Search
USPC ................. 361/111–115, 600, 601, 621–624, 361/641–648, 657, 678, 722–728; 307/11, 307/12, 18, 43, 48, 64–70, 125, 126, 141, 307/141.4, 143; 337/186, 189; 312/223.2, 312/223.3, 265.1, 265.3, 265.5; 439/535, 439/55, 65, 652 M, 114; 174/38, 50, 59, 60
See application file for complete search history.

(56) References Cited

U.S. PATENT DOCUMENTS

| | | | | |
|---|---|---|---|---|
| 5,047,961 A * | 9/1991 | Simonsen | | 702/63 |
| 5,381,554 A * | 1/1995 | Langer et al. | | 714/14 |
| 5,694,312 A * | 12/1997 | Brand et al. | | 363/144 |
| 5,821,636 A * | 10/1998 | Baker et al. | | 307/70 |
| 5,955,869 A * | 9/1999 | Rathmann | | 320/132 |
| 6,200,159 B1 * | 3/2001 | Chou | | 439/535 |
| 6,301,095 B1 * | 10/2001 | Laughlin et al. | | 361/624 |
| 6,310,783 B1 * | 10/2001 | Winch et al. | | 361/797 |
| 6,456,507 B1 * | 9/2002 | Yang et al. | | 361/829 |
| 6,563,048 B2 * | 5/2003 | Holt et al. | | 174/50 |
| 6,687,701 B2 * | 2/2004 | Karamanolis et al. | | 1/1 |
| 6,693,371 B2 * | 2/2004 | Ziegler et al. | | 307/64 |
| 6,700,351 B2 * | 3/2004 | Blair et al. | | 320/125 |
| 6,787,259 B2 * | 9/2004 | Colborn et al. | | 429/430 |
| 6,822,859 B2 * | 11/2004 | Coglitore et al. | | 361/679.49 |
| 6,826,036 B2 * | 11/2004 | Pereira | | 361/624 |
| 6,923,676 B2 * | 8/2005 | Perry | | 439/500 |
| 6,993,680 B2 * | 1/2006 | Fukumori | | 714/14 |
| 7,053,502 B2 * | 5/2006 | Aihara et al. | | 307/46 |

(Continued)

FOREIGN PATENT DOCUMENTS

JP 02001093584 A * 4/2001 ............ H01M 10/46

OTHER PUBLICATIONS

Invitation to Pay Additional Fees and, Where Applicable, Protest Fee, PCT/US2011/054687, Mar. 6, 2012.

(Continued)

*Primary Examiner* — Michail V Datskovskiy
(74) *Attorney, Agent, or Firm* — Myers Bigel Sibley & Sajovec

(57) ABSTRACT

High density uninterruptible power supplies are provided including an enclosure and at least one uninterruptible power supply positioned in the enclosure. A battery associated with the at least one uninterruptible power supply is positioned in the enclosure. The at least one uninterruptible power supply and the associated battery are configured to provide at least thirty seconds of backup power to a load connected thereto. Related systems and power distribution units are also provided.

25 Claims, 4 Drawing Sheets

(56) References Cited

U.S. PATENT DOCUMENTS

| | | | |
|---|---|---|---|
| 7,116,550 B2* | 10/2006 | Ewing et al. | 361/623 |
| 7,116,558 B2* | 10/2006 | Sugihara | 361/724 |
| 7,123,485 B1* | 10/2006 | Henderson | 361/724 |
| 7,144,320 B2* | 12/2006 | Turek et al. | 454/184 |
| 7,173,821 B2* | 2/2007 | Coglitore | 361/695 |
| 7,209,357 B2* | 4/2007 | Zansky et al. | 361/731 |
| 7,236,896 B2* | 6/2007 | Farkas et al. | 702/60 |
| 7,252,524 B1* | 8/2007 | Johnson et al. | 439/210 |
| 7,259,477 B2* | 8/2007 | Klikic et al. | 307/65 |
| 7,277,273 B2* | 10/2007 | Smith et al. | 361/679.01 |
| 7,301,249 B2* | 11/2007 | Stranberg et al. | 307/66 |
| 7,349,209 B2* | 3/2008 | Campbell et al. | 361/694 |
| 7,377,807 B2* | 5/2008 | Ohman | 439/535 |
| 7,379,305 B2* | 5/2008 | Briggs et al. | 361/727 |
| 7,385,805 B2* | 6/2008 | Germagian et al. | 361/644 |
| 7,402,062 B2* | 7/2008 | Perry | 439/248 |
| 7,495,415 B2* | 2/2009 | Kanouda et al. | 320/112 |
| 7,508,663 B2* | 3/2009 | Coglitore | 361/695 |
| 7,522,036 B1* | 4/2009 | Preuss et al. | 340/531 |
| 7,542,268 B2* | 6/2009 | Johnson, Jr. | 361/622 |
| 7,561,411 B2* | 7/2009 | Johnson, Jr. | 361/600 |
| 7,573,232 B2* | 8/2009 | Cheng et al. | 320/115 |
| 7,595,985 B2* | 9/2009 | Adducci et al. | 361/695 |
| 7,646,590 B1* | 1/2010 | Corhodzic et al. | 361/641 |
| 7,646,603 B2* | 1/2010 | Bard et al. | 361/696 |
| 7,719,835 B1* | 5/2010 | Schluter | 361/695 |
| 7,781,914 B2* | 8/2010 | Kotlyar et al. | 307/65 |
| 7,783,055 B2* | 8/2010 | Barath et al. | 381/71.3 |
| 7,786,618 B2* | 8/2010 | Cohen et al. | 307/65 |
| 7,878,888 B2* | 2/2011 | Rasmussen et al. | 454/184 |
| 7,940,709 B2* | 5/2011 | Curcio et al. | 370/310.1 |
| 7,944,692 B2* | 5/2011 | Grantham et al. | 361/688 |
| 8,004,115 B2* | 8/2011 | Chapel et al. | 307/64 |
| 8,031,468 B2* | 10/2011 | Bean et al. | 361/696 |
| 8,049,364 B2* | 11/2011 | Shakespeare et al. | 307/64 |
| 8,076,798 B2* | 12/2011 | Mehler et al. | 307/64 |
| 8,087,979 B2* | 1/2012 | Rasmussen | 454/184 |
| 8,135,973 B2* | 3/2012 | Helfinstine et al. | 713/340 |
| 8,148,846 B2* | 4/2012 | Masciarelli et al. | 307/66 |
| 8,162,417 B2* | 4/2012 | Briggs et al. | 312/223.2 |
| 8,164,897 B2* | 4/2012 | Graybill et al. | 361/679.49 |
| 8,174,149 B2* | 5/2012 | Chapel et al. | 307/64 |
| 8,184,435 B2* | 5/2012 | Bean et al. | 361/696 |
| 8,384,244 B2* | 2/2013 | Peterson et al. | 307/66 |
| 8,415,831 B1* | 4/2013 | Hayes et al. | 307/66 |
| 2003/0121689 A1 | 7/2003 | Rasmussen et al. | |
| 2003/0133263 A1* | 7/2003 | Shu | 361/685 |
| 2003/0160514 A1 | 8/2003 | Rajagopalan | |
| 2003/0220026 A1* | 11/2003 | Oki et al. | 439/894 |
| 2004/0263123 A1* | 12/2004 | Breen et al. | 320/128 |
| 2005/0162019 A1* | 7/2005 | Masciarelli et al. | 307/66 |
| 2005/0189817 A1* | 9/2005 | Johnson et al. | 307/39 |
| 2005/0225914 A1* | 10/2005 | King | 361/62 |
| 2007/0114852 A1* | 5/2007 | Lin et al. | 307/66 |
| 2007/0217125 A1 | 9/2007 | Johnson | |
| 2007/0217128 A1* | 9/2007 | Johnson, Jr. | 361/622 |
| 2007/0217178 A1* | 9/2007 | Johnson et al. | 361/826 |
| 2008/0093927 A1* | 4/2008 | Ewing et al. | 307/23 |
| 2008/0215900 A1* | 9/2008 | Bahali et al. | 713/300 |
| 2009/0031153 A1* | 1/2009 | Bahali et al. | 713/310 |
| 2010/0042860 A1* | 2/2010 | Kwon et al. | 713/340 |
| 2010/0211810 A1* | 8/2010 | Zacho | 713/324 |
| 2011/0215645 A1* | 9/2011 | Schomburg et al. | 307/65 |
| 2012/0092811 A1* | 4/2012 | Chapel et al. | 361/622 |

OTHER PUBLICATIONS

Notification of Transmittal of the International Search Report and the Written Opinion of the International Searching Authority, or the Declaration, PCT/US2011/054687, May 11, 2012.

Polastre, Joe, "Top 5 myths about Google data centers," http://www.zdnet.com/news/top-5-myths-about-google-data-centers/417847, Apr. 29, 2010.

Hruska, Joel, The Beast unveiled: inside a Google server, http://arstechnica.com/hardware/news/2009/04/the-beast-unveiled-inside-a-google-server.ars, Apr. 2, 2009.

Shankland, Stephen, "Google uncloaks once-secret server," http://news.cnet.com/8301-1001_3-10209580-92.html, Apr. 1, 2009.

Fehrenbacher, Katie, A Key to Google's Data Center Efficiency: One Battery Backup Per Server, http://gigaom.com/cleantech/a-key-to-googles-data-center-efficiency-one-backup-battery-per-server/, Apr. 1, 2009.

Notification Concerning Transmittal of the International Preliminary Report on Patentability (Chapter I of the Patent Cooperation Treaty), PCT/US2011/054687 May 2, 2013.

* cited by examiner

HIGH DENSITY UNINTERRUPTIBLE POWER SUPPLIES AND RELATED SYSTEMS AND POWER DISTRIBUTION UNITS

FIELD

The inventive subject matter generally relates to uninterruptible power supplies and, more particularly, to high density uninterruptible power supplies.

BACKGROUND

Uninterruptible power supply (UPS) systems are commonly used in installations such as data centers, medical centers and industrial facilities. UPS systems may be used in such installations to provide backup power to maintain operation of computer, medical devices and other critical equipment in event of failure of a primary utility supply. These UPS systems commonly have an "on-line" configuration including a rectifier and inverter coupled by a DC link that is also coupled to a backup power source, such as a battery. Other UPS configurations may also be used, such as standby and line-interactive configurations.

However, data centers are evolving from data centers having dedicated IT equipment for specific applications to data centers having managed IT equipment that is application insensitive, i.e. cloud computing. This fundamental change to the data centers may have an impact on the type of UPS system needed to provide backup power to maintain operations in the data centers in the event of failure of the primary utility supply.

SUMMARY

Some embodiments of the inventive subject matter provide high density uninterruptible power supplies including an enclosure and at least one uninterruptible power supply positioned in the enclosure. A battery associated with the at least one uninterruptible power supply is also positioned in the enclosure. The at least one uninterruptible power supply and the associated battery are configured to provide at least thirty seconds of backup power to a load connected thereto.

In further embodiments, the enclosure may be a first enclosure and the first enclosure may be configured to be connected to at least one power distribution unit. The at least one power distribution unit may be positioned in a second enclosure, separate from the first enclosure.

In still further embodiments, the at least one power distribution unit may include a plurality of receptacles therein.

In some embodiments, first enclosure may include at least one utility input connection that is configured to provide power from a utility.

In further embodiments, the power distribution unit in the second enclosure may include a utility input connection. The at least one power distribution unit may further include a transfer relay positioned in the second enclosure.

In still further embodiments, the at least one uninterruptible power supply includes four uninterruptible power supplies positioned in the first enclosure and each of the four uninterruptible power supplies may have an associated battery. The four uninterruptible power supplies may provide up to 30 seconds of battery.

Some embodiments of the present inventive subject matter provide systems for providing backup power including a first enclosure including at least one uninterruptible power supply and a battery associated with the at least one uninterruptible power supply. The at least one uninterruptible power supply and the associated battery are configured to provide at least thirty seconds of backup power to a load connected thereto. The system further includes at least one second enclosure, separate from the first enclosure, which includes a power distribution unit and is configured to be connected to the first enclosure.

In further embodiments, the power distribution unit may include a plurality of receptacles on the second enclosure.

In still further embodiments, the first enclosure may further include at least one utility input connection that is configured to provide power from a utility.

In some embodiments, the second enclosure including the power distribution unit may further include a utility input connection therein. The power distribution unit may further include a transfer relay positioned in the second enclosure.

In further embodiments, the at least one uninterruptible power supply includes four uninterruptible power supplies positioned in the first enclosure, each of the four uninterruptible power supplies having an associated battery. The four uninterruptible power supplies may provide up to 30 seconds of battery.

Still further embodiments of the present inventive subject matter provide power distribution units including a power distribution unit enclosure and at least one uninterruptible power supply positioned in the power distribution unit enclosure. A battery associated with the at least one uninterruptible power supply is also positioned in the power distribution unit enclosure. The at least one uninterruptible power supply and the associated battery are configured to provide at least thirty seconds of backup power to a load connected thereto. A plurality of receptacles are also provided on the power distribution unit enclosure.

In some embodiments, the power distribution unit may occupy zero U-space in IT racks.

Further embodiments of the present inventive subject matter provide high density uninterruptible power supplies including an enclosure; at least one uninterruptible power supply positioned in the enclosure; and a battery associated with the at least one uninterruptible power supply and positioned in the enclosure, wherein the enclosure does not contain any substantial means for cooling the at least one uninterruptable power supply and the battery in the enclosure.

In still further embodiments, a density of the high density uninterruptible power supply may be increased due to the absence of any substantial cooling means.

In some embodiments, the at least one uninterruptible power supply and the associated battery may be configured to provide at least thirty seconds of backup power to a load connected thereto.

In further embodiments, the enclosure comprises a first enclosure and wherein the first enclosure is configured to be connected to at least one power distribution unit, the at least one power distribution unit being positioned in a second enclosure, separate from the first enclosure. In certain embodiments, the at least one power distribution unit may include a plurality of receptacles therein.

In still further embodiments, at least one utility input connection may be included that is configured to provide power from a utility.

In some embodiments, the power distribution unit in the second enclosure may include a utility input connection. The at least one power distribution unit may include a transfer relay positioned in the second enclosure.

In further embodiments, the at least one uninterruptible power supply may be configured to provide no greater than about 30 seconds of battery.

DETAILED DESCRIPTION OF EMBODIMENTS

Figure 1:
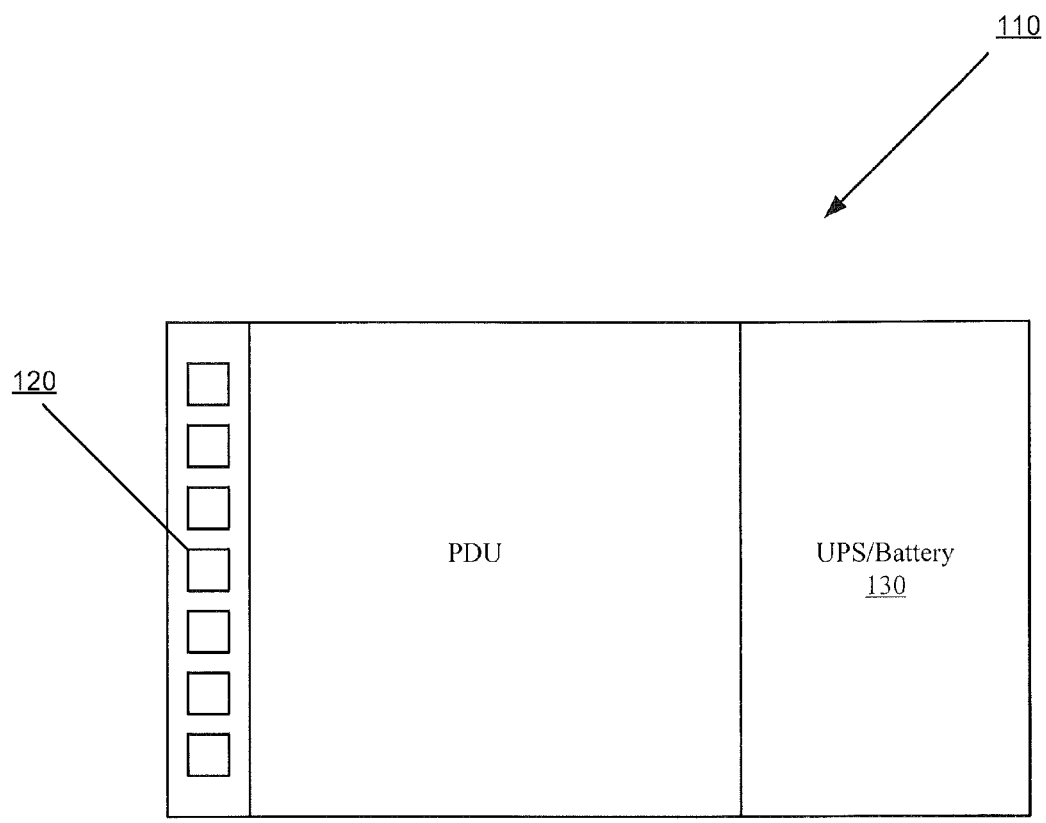
FIG. 1 is a block diagram illustrating an uninterruptible power supply integrated in a power distribution unit in accordance with some embodiments of the present inventive subject matter.

The inventive subject matter now will be described more fully hereinafter with reference to the accompanying drawings, in which illustrative embodiments of the inventive subject matter are shown. In the drawings, the relative sizes of regions or features may be exaggerated for clarity. This inventive subject matter may, however, be embodied in many different forms and should not be construed as limited to the embodiments set forth herein; rather, these embodiments are provided so that this disclosure will be thorough and complete, and will fully convey the scope of the inventive subject matter to those skilled in the art.

It will be understood that when an element is referred to as being "coupled" or "connected" to another element, it can be directly coupled or connected to the other element or intervening elements may also be present. In contrast, when an element is referred to as being "directly coupled" or "directly connected" to another element, there are no intervening elements present. Like numbers refer to like elements throughout. As used herein the term "and/or" includes any and all combinations of one or more of the associated listed items.

In addition, spatially relative terms, such as "under", "below", "lower", "over", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "under" or "beneath" other elements or features would then be oriented "over" the other elements or features. Thus, the exemplary term "under" can encompass both an orientation of over and under. The device may be otherwise oriented (rotated 90 degrees or at other orientations) and the spatially relative descriptors used herein interpreted accordingly.

The terminology used herein is for the purpose of describing particular embodiments only and is not intended to be limiting of the inventive subject matter. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein the expression "and/or" includes any and all combinations of one or more of the associated listed items.

Unless otherwise defined, all terms (including technical and scientific terms) used herein have the same meaning as commonly understood by one of ordinary skill in the art to which this inventive subject matter belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

As discussed above, data centers are changing from application-dedicated IT equipment to managed servers operating in a cloud environment. In a cloud environment, applications can be moved quickly to other groups of servers or different locations in a matter of minutes. Thus, the reduction in time to suspend or relocate the application reduces the need for the traditional UPS and associated backup times. In other words, the reduction in backup time requirement may allow the battery to be reduced in size and, thus, can be incorporated within the IT equipment. For example, one implementation severs having a battery therein. In this implementation, the battery backup does not require any additional space in the rack, but the server is not very dense. Customers that make high density servers may need a dense UPS solution without special server designs.

Accordingly, some embodiments discussed herein provide a high density UPS solution suitable for use in evolving data centers. As will be discussed further below with respect to FIGS. 1 through 5, there are several implementations/form factors that may be used for high density UPS systems in accordance with embodiments discussed herein. Furthermore, in some embodiments, the high density UPS systems may not include any forced air flow from front to back to cooling during a discharge period, i.e. no substantial cooling means may be included in the system. It will be understood that "no substantial means of cooling" can include a small fan or similar device to provide some cooling without departing from the scope of the present inventive subject matter. The absence of any substantial cooling means may allow provision of increasingly dense UPS systems as discussed further herein.

Referring first to FIG. 1, a block diagram of a UPS integrated with a power distribution unit (PDU) in accordance with some embodiments will be discussed. As discussed above, in the changing data center environment, five or more minutes of backup time to suspend or relocate the application may not be necessary. For example, in a cloud environment, only a minute or less, for example, 30 seconds, of backup time may be needed to switch from one group of servers to a duplicate server group. Furthermore, the nature of the load being backed up by the UPS has also changed, i.e. the load is more tolerant to wide variations of utility voltage because they have power factor corrected power supplies. The combination of these changes has reduced the need for any regulation in the UPS, thus allowing an offline UPS topology to fill the need for backup power in the new data center environment.

As illustrated in FIG. 1, some embodiments combine the UPS/battery 130 and the PDU 110 in a single enclosure. As illustrated, in the embodiments illustrated in FIG. 1, the output receptacles 120 may be provided at one end of the PDU 110 and the UPS/battery 130 in accordance with embodiments discussed herein may be provided at the opposite end of the PDU 110. The UPS/battery 130 may support its full load for about 30 seconds to no more than about a minute. In these embodiments, the UPS/battery 130 may be 3 kW modules. The use of a fan may be limited and thermal mass may be the dominate temperature control for the semiconductor switches.

IT racks with provision to mount electronic chassis are commonly used in telecommunications and computer networking applications. A typical data center, for example, may include multiple racks in which equipment chassis, e.g., servers, storage units, power supplies and the like, are inserted and mounted. The amount of space a piece of equipment occupies in the IT rack can be expressed in "U" units, which is a unit of measure equal to 1.75. The PDU 110 including the receptacles 120, the UPS/battery 130 and various other circuitry not shown in FIG. 1 may be installed in IT racks in zero-U format, i.e. not occupying any space on the IT racks. However, due to the battery 130 and electronics (not shown) included in the combined PDU/UPS illustrated in FIG. 1, this implementation may have a significantly larger cross section than a conventional PDU, which may make the configuration illustrated in FIG. 1 less desirable. Furthermore, typically PDUs are placed in the rear of the IT rack where the temperature is typically higher. Thus, placing the combination PDU/UPS in this position may cause the battery to experience a very short operational life.

Figure 2:
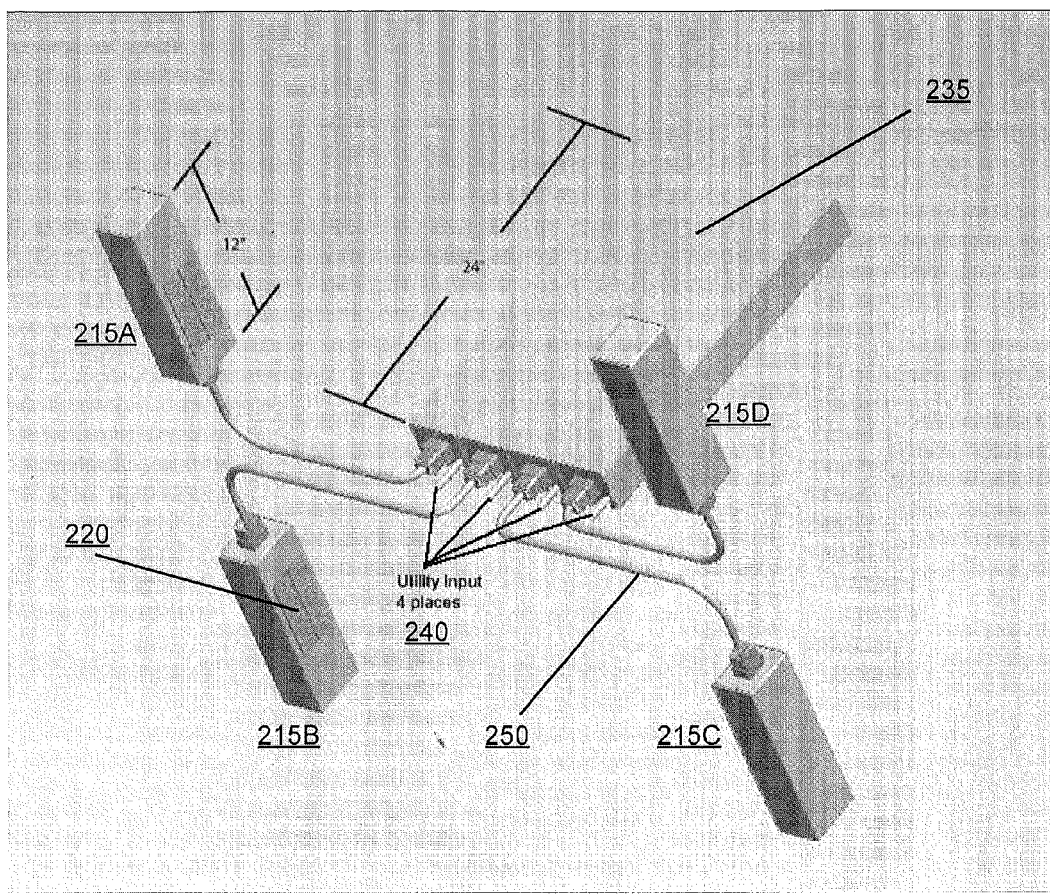
FIG. 2 is a block diagram illustrating uninterruptible power supply systems in accordance with some embodiments of the present inventive subject matter.

Referring now to FIG. 2, a block diagram illustrating UPS systems in accordance with some embodiments of the present inventive subject matter will be discussed. As illustrated in FIG. 2, the UPS system includes a UPS/battery module 235 and one or more PDU/receptacles 215A through 215D including one or more individual receptacles 220 thereon. As illustrated, the UPS and battery are provided in a first enclosure 235 and the output receptacles 215A through 215D are provided in a second enclosure 215A through 215D, separate from the first enclosure 235.

It will be understood that although four output receptacles/PDUs 215A through 215D are illustrated in FIG. 2, embodiments of the present inventive subject matter are not limited to this configuration. More or less than four receptacles 215A through 215D may be provided without departing from the scope of the present invention subject matter.

The output receptacles 215A through 215D can be mounted in the traditional zero-U space of the IT racks. The output receptacles 215A through 215D will have a smaller cross section than embodiments discussed above with respect to FIG. 1 as the UPS and battery are provided in a separate enclosure 235. In some embodiments, the PDUs 215A through 215D illustrated in FIG. 2 may be standard/conventional PDUs/output receptacles, which occupy zero-U space in the rear of the IT rack.

Although some embodiments are discussed herein as occupying a certain amount of space in the IT racks, embodiments of the present inventive subject matter are not limited to this configuration. For example, embodiments discussed herein can occupy more or less space than discussed without departing from the scope of the subject matter discussed herein.

Figure 4:
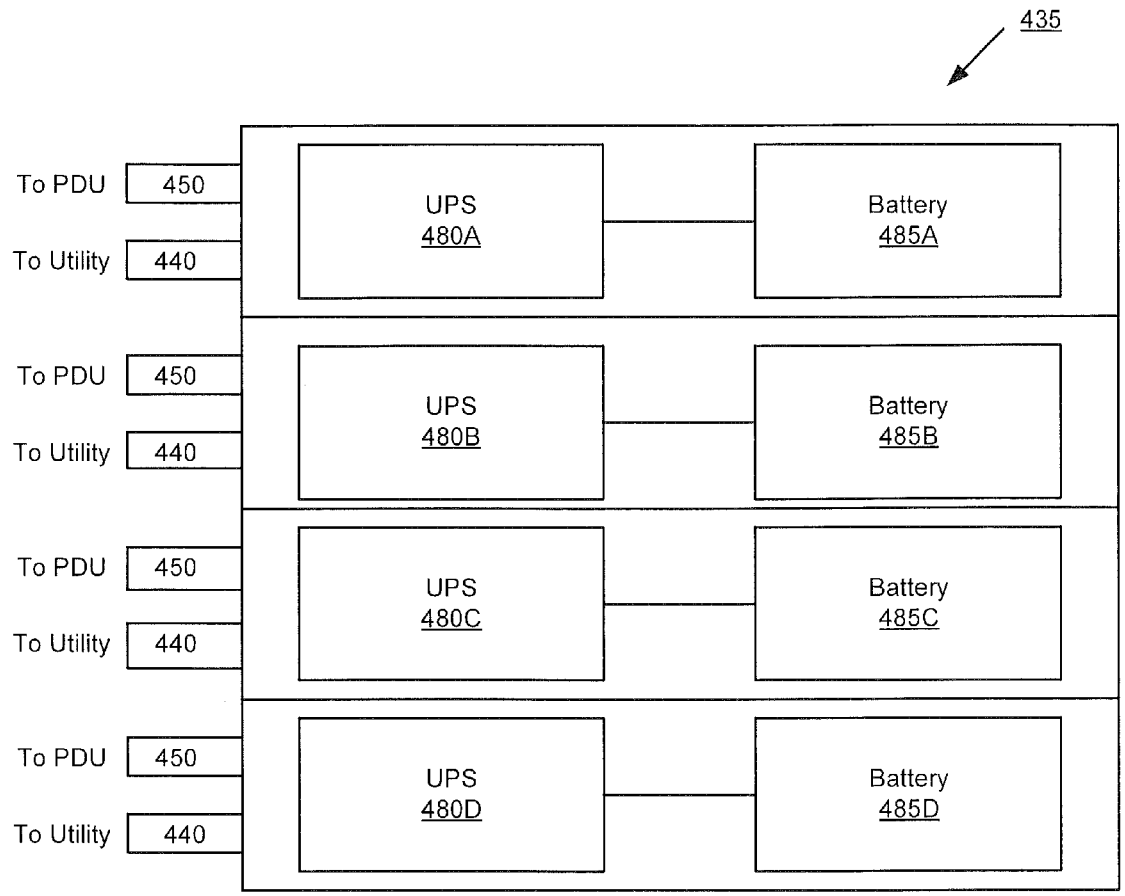
FIG. 4 is a block diagram of a universal power supply module in accordance with some embodiments of the present inventive subject matter.

As illustrated in FIG. 4, the UPS and battery enclosure 435 may include one or more UPS 480A-480D and battery 485A-485D pairs, each having an associated PDU cord 450 and utility cord 440. The UPS and battery enclosure 435 may be mounted in a 2 U chassis, Le, the UPS and battery enclosure 435 occupies 2 U of space in the IT racks. The UPS 480A-480D in accordance with some embodiments may be a 3 kVA UPS. The 3 KVa UPS and the associated battery may only occupy one quarter of the IT rack width, allowing up to four UPS/battery pairs to fit in a 2 U IT rack enclosure 435 as illustrated in FIG. 4. Thus, combined the four UPS/battery pairs provide a 12 kW UPS having about 30 seconds of battery in 2 U IT rack space. The individual 3 kVA UPS modules 480A-480D may or may not be interconnected without departing from the scope of embodiments discussed herein.

Although embodiments of the present invention illustrated in FIG. 4 include four UPS/battery pairs in the enclosure 435, it will be understood that embodiments of the present inventive subject matter are not limited to this configuration. For example, more or less than four pairs may be included in the enclosure 435 without departing from the scope of embodiments discussed herein. It will be understood that if more than four pairs are included in the enclosure 435, the enclosure may occupy more than the 2 U of rack space discussed above.

As further illustrated in FIG. 4, in some embodiments, the battery 485A-485D is placed facing toward the input side of the enclosure 435 where it is cooler to preserve operational life of the battery and the UPS 480A-480D is provided in the rear of the enclosure 435.

Referring again to FIG. 2, a cord 250 is attached to the UPS enclosure 235 and the receptacles/PDUs 215A through 215D are plugged into the UPS enclosure 235. The UPS/battery enclosure 235 may also include a plurality of inputs for power from the utility 240 as shown.

Figure 3:
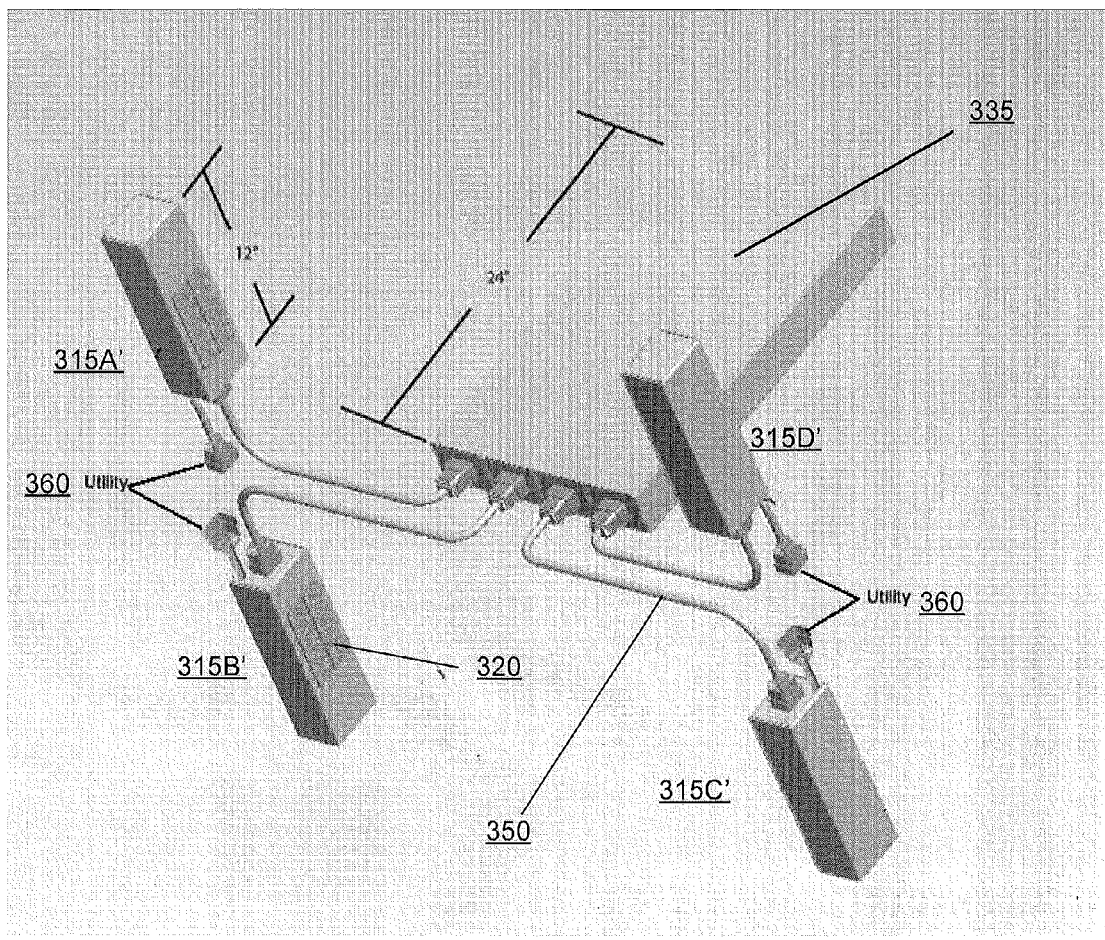
FIG. 3 is a diagram illustrating uninterruptible power supply systems in accordance with some embodiments of the present inventive subject matter.
Figure 5:
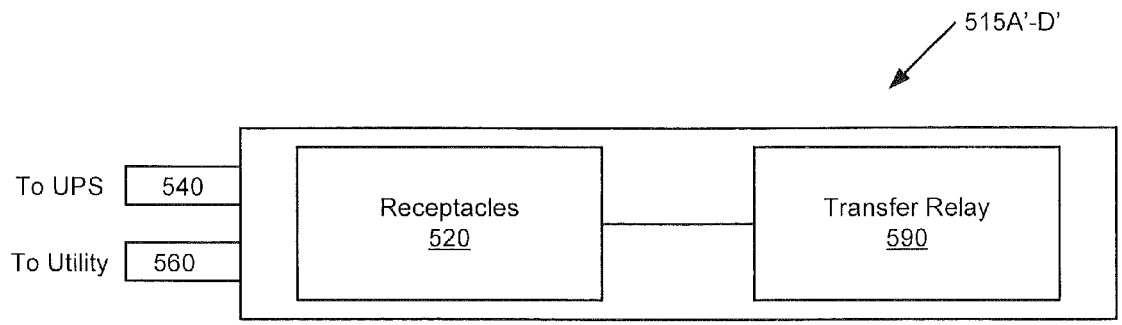
FIG. 5 is a block diagram of a power distribution unit in accordance with some embodiments of the present invention.

Referring now to FIG. 3, a UPS system in accordance with some embodiments will be discussed. As illustrated in FIG. 3, the UPS system includes a UPS/battery enclosure 335 and at least one PDU/receptacle 315A' through 315D'. The UPS/battery module 335 and the PDUs 315A' through 315D' including one or more receptacles 320 are provided in separate enclosures as shown. FIG. 5 illustrates the PDUs 315A' through 315D' in detail. As illustrated therein, an input cord 360/560 is attached to each of the PDUs 515A' through 515D' and each PDU enclosure 515A' through 515D' includes a transfer relay 590 therein.

Referring again to FIG. 3, the input cord 360 is used to connect the PDUs 315A' through 315D' to the utility power. As shown, similar to embodiments illustrated in FIG. 2, the UPS and battery module 335 is attached to the PDUs 315A' through 315D' using a cord 350. Since the PDUs 315A' through 315D' are directly attached to the utility power using the input cord 360, the UPS and/or battery in enclosure 335 may be replaced without interruption of power to the load connected to the output receptacles of the PDUs 315A' through 315D'. Thus, the modified PDUs 315A' through 315D' provide a "power pass" PDU that allows UPS and battery servicing without load interruption.

As discussed above, some embodiments of discussed above with respect to FIGS. 1 through 3 provide a UPS associated with a battery that will provide a minute or less, for example, 30 seconds, of backup time that may be needed to switch from one group of servers to a duplicate server group. Embodiments of the UPS, PDUs and systems discussed above may provide five times more density over existing systems and products.

In the drawings and specification, there have been disclosed exemplary embodiments of the inventive subject matter. Although specific terms are employed, they are used in a generic and descriptive sense only and not for purposes of limitation, the scope of the inventive subject matter being defined by the following claims.

That which is claimed:

1. A high density uninterruptible power supply comprising:
an enclosure configured to be installed in an information technology (IT) rack and being separate from the IT rack;
at least two uninterruptible power supplies positioned in the enclosure; and a battery associated with each of the at least two uninterruptible power supplies and positioned in the enclosure, the at least two uninterruptible power supplies and the associated batteries being configured to provide at least thirty seconds of backup power and no greater than about one minute of backup power to a load connected thereto.

2. The high density uninterruptible power supply of claim 1, wherein the enclosure comprises a first enclosure and wherein the first enclosure is configured to be connected to at least one power distribution unit, the at least one power distribution unit being positioned in a second enclosure, separate from the first enclosure.

3. The high density uninterruptible power supply of claim 2, wherein the at least one power distribution unit includes a plurality of receptacles therein.

4. The high density uninterruptible power supply of claim 2, further comprising at least one utility input connection that is configured to provide power from a utility.

5. The high density uninterruptible power supply of claim 2, wherein the power distribution unit in the second enclosure comprises a utility input connection.

6. The high density uninterruptible power supply of claim 5, wherein the at least one power distribution unit further comprises a transfer relay positioned in the second enclosure.

7. The high density uninterruptible power supply of claim 2:
wherein the at least two uninterruptible power supplies comprises four uninterruptible power supplies positioned in the first enclosure, each of the four uninterruptible power supplies having an associated battery.

8. The high density uninterruptible power supply of claim 7, wherein the four uninterruptible power supplies and the associated batteries are configured to provide up to 30 seconds of backup power to the load connected thereto.

9. A system for providing backup power comprising:
a first enclosure including at least two uninterruptible power supplies and a battery associated with each of the at least two uninterruptible power supplies, wherein the first enclosure is configured to be installed in an information technology (IT) rack and is separate from the IT rack and wherein the at least two uninterruptible power supplies and the associated batteries being configured to provide at least thirty seconds of backup power and no greater than about one minute of backup power to a load connected thereto; and
at least one second enclosure, separate from the first enclosure, including a power distribution unit, the second enclosure configured to be connected to the first enclosure.

10. The system of claim 9, wherein the power distribution unit includes a plurality of receptacles on the second enclosure.

11. The system of claim 9, wherein the first enclosure further comprises at least one utility input connection that is configured to provide power from a utility.

12. The system of claim 9, wherein the second enclosure including the power distribution unit further comprises a utility input connection therein.

13. The system of claim 12, wherein the power distribution unit further comprises a transfer relay positioned in the second enclosure.

14. The system of claim 9:
wherein the at least two uninterruptible power supplies comprises four uninterruptible power supplies positioned in the first enclosure, each of the four uninterruptible power supplies having an associated battery.

15. The system of claim 14, wherein the four uninterruptible power supplies and the associated batteries provide up to 30 seconds of backup power to the load connected thereto.

16. A power distribution unit comprising:
a power distribution unit enclosure configured to be installed in an information technology (IT) rack and being separate from the IT rack;
at least two uninterruptible power supplies positioned in the power distribution unit enclosure;
a battery associated with each of the at least two uninterruptible power supplies and positioned in the power distribution unit enclosure, the at least two uninterruptible power supplies and the associated battery being configured to provide at least thirty seconds of backup power and no greater than about one minute of backup power to a load connected thereto; and
a plurality of receptacles on the power distribution unit enclosure.

17. A high density uninterruptible power supply comprising:
an enclosure configured to be installed in an information technology (IT) rack and being separate from the IT rack;
at least two uninterruptible power supplies positioned in the enclosure; and
a battery associated with each of the at least two uninterruptible power supplies and positioned in the enclosure, wherein the enclosure does not contain any forced air flow from front to back to cooling during a discharge period for cooling the at least two uninterruptable power supplies and the associated batteries in the enclosure.

18. The high density uninterruptible power supply of claim 17, wherein a density of the high density uninterruptible power supply is increased.

19. The high density uninterruptible power supply of claim 17, wherein the at least two uninterruptible power supplies and the associated batteries are configured to provide at least thirty seconds of backup power to a load connected thereto.

20. The high density uninterruptible power supply of claim 19, wherein the enclosure comprises a first enclosure and wherein the first enclosure is configured to be connected to at least one power distribution unit, the at least one power distribution unit being positioned in a second enclosure, separate from the first enclosure.

21. The high density uninterruptible power supply of claim 20, wherein the at least one power distribution unit includes a plurality of receptacles therein.

22. The high density uninterruptible power supply of claim 20, further comprising at least one utility input connection that is configured to provide power from a utility.

23. The high density uninterruptible power supply of claim 20, wherein the power distribution unit in the second enclosure comprises a utility input connection.

24. The high density uninterruptible power supply of claim 23, wherein the at least one power distribution unit further comprises a transfer relay positioned in the second enclosure.

25. The high density uninterruptible power supply of claim 17, wherein the at least uninterruptible power supplies and the associated batteries are configured to provide no greater than about 30 seconds of backup power to the load connected thereto.

\* \* \* \* \*